US010573722B2

(12) United States Patent
Gorczyca

(10) Patent No.: US 10,573,722 B2
(45) Date of Patent: Feb. 25, 2020

(54) SYSTEMS AND METHODS FOR IN-SITU DOPED SEMICONDUCTOR GATE ELECTRODES FOR WIDE BANDGAP SEMICONDUCTOR POWER DEVICES

(71) Applicant: General Electric Company, Schenectady, NY (US)

(72) Inventor: Thomas Bert Gorczyca, Schenectady, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 251 days.

(21) Appl. No.: 15/046,184

(22) Filed: Feb. 17, 2016

(65) Prior Publication Data

US 2017/0236915 A1    Aug. 17, 2017

(51) Int. Cl.
| | |
|---|---|
| H01L 29/66 | (2006.01) |
| H01L 29/49 | (2006.01) |
| H01L 29/78 | (2006.01) |
| H01L 21/04 | (2006.01) |
| H01L 21/324 | (2006.01) |
| H01L 29/16 | (2006.01) |
| H01L 29/40 | (2006.01) |

(52) U.S. Cl.
CPC ........ *H01L 29/4933* (2013.01); *H01L 21/049* (2013.01); *H01L 21/324* (2013.01); *H01L 29/1608* (2013.01); *H01L 29/401* (2013.01); *H01L 29/4916* (2013.01); *H01L 29/66068* (2013.01); *H01L 29/7802* (2013.01)

(58) Field of Classification Search
CPC ................................................ H01L 29/66068
USPC .......................................................... 438/285
See application file for complete search history.

(56) References Cited

U.S. PATENT DOCUMENTS

| | | | |
|---|---|---|---|
| 5,140,390 | A | 8/1992 | Li et al. |
| 5,439,831 | A | 8/1995 | Schwalke et al. |
| 5,736,419 | A | 4/1998 | Naem |
| 6,063,698 | A | 5/2000 | Tseng et al. |
| 7,217,950 | B2 | 5/2007 | Kaneko et al. |
| 8,247,840 | B2 | 8/2012 | Kapoor et al. |
| 2001/0008788 | A1 | 7/2001 | Hshieh et al. |

(Continued)

FOREIGN PATENT DOCUMENTS

WO       2015/008336       *   1/2015

OTHER PUBLICATIONS

International Search Report and Written Opinion issued in connection with corresponding PCT Application No. PCT/US2017/012781 dated Apr. 10, 2017.

(Continued)

*Primary Examiner* — Hsin Yi Hsieh
(74) *Attorney, Agent, or Firm* — Fletcher Yoder, P.C.

(57) ABSTRACT

In an embodiment, a wide bandgap semiconductor power device, includes a wide bandgap semiconductor substrate layer; an epitaxial semiconductor layer disposed above the wide bandgap semiconductor substrate layer; a gate dielectric layer disposed directly over a portion of the epitaxial semiconductor layer; and a gate electrode disposed directly over the gate dielectric layer. The gate electrode includes an in-situ doped semiconductor layer disposed directly over the gate dielectric layer and a metal-containing layer disposed directly over the in-situ doped semiconductor layer.

9 Claims, 10 Drawing Sheets

(56) References Cited

U.S. PATENT DOCUMENTS

| | | | |
|---|---|---|---|
| 2002/0160559 A1* | 10/2002 | Lee | H01L 28/40 438/200 |
| 2003/0124818 A1* | 7/2003 | Luo | C23C 16/24 438/482 |
| 2005/0236151 A1 | 10/2005 | Haglid | |
| 2009/0227098 A1* | 9/2009 | Matsuyama | H01L 21/049 438/585 |
| 2009/0227100 A1 | 9/2009 | Yamanobe et al. | |
| 2013/0234159 A1 | 9/2013 | Tsuchiya | |
| 2014/0145209 A1 | 5/2014 | Kumagai | |
| 2015/0144960 A1 | 5/2015 | Sala et al. | |
| 2015/0236151 A1 | 8/2015 | McMohan et al. | |
| 2016/0149025 A1* | 5/2016 | Mori | H01L 29/4925 257/77 |

OTHER PUBLICATIONS

Khan M K et al., "The effect of gate doping on the electrical conduction and reliability of thick gate oxides", Power Semiconductor Devices and IC's, 1997. ISPSD '97., 1997 IEEE International, pp. 145-148, May 26-29, 1997, Weimar.

Tsubo et al., "Phosphorus Diffusion from Doped Polysilicon through Ultra-Thin SiO2 Films into Si Substrates", Japanese Journal of Applied Physics, vol. 39, pp. L 955-L957, Part: 2, No. 10A, Oct. 2000.

* cited by examiner

SYSTEMS AND METHODS FOR IN-SITU DOPED SEMICONDUCTOR GATE ELECTRODES FOR WIDE BANDGAP SEMICONDUCTOR POWER DEVICES

BACKGROUND

The subject matter disclosed herein relates to wide bandgap semiconductor devices, such as silicon carbide (SiC) power devices, including field transistors (e.g., MOSFET, DMOSFET, UMOSFET, VMOSFET, trench MOSFET, etc.), insulated gate bipolar transistors (IGBT), and insulated base MOS-controlled thyristors (IBMCT).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Semiconductor power devices are widely used throughout modern electrical systems to convert electrical power from one form to another form for consumption by a load. Many semiconductor power devices utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors) to perform their intended functions. Specifically for high-frequency, high-voltage, and/or high-current applications, wide bandgap semiconductor power devices can provide a number of advantages over other semiconductor device in terms of high temperature operation, reduced conduction and switching losses, and smaller die size.

Some wide bandgap semiconductor power devices may include a sputtered or evaporated metal gate electrode. However, since metals have a tendency to migrate at high temperature, a metal gate electrode can reduce the temperature capability and the reliability of a wide bandgap semiconductor power device. As such, some wide bandgap semiconductor power devices include polycrystalline silicon (polysilicon) gate electrode. Since the gate electrode should have a relatively high conductivity, such polysilicon gate electrodes are typically doped after formation of the gate electrode, for example, via treatment with phosphoryl chloride ($POCl_3$). However, this treatment can introduce instability into the wide bandgap semiconductor power device. For example, phosphoryl chloride treatment generally results in an accumulation of dopant atoms at the surfaces of the gate electrode, including the lower surface of the gate electrode, near the underlying gate dielectric. Additionally, this treatment can result in a portion of the phosphorus dopant atoms diffusing into the gate dielectric itself. Dopant diffusion into and around the gate dielectric can negatively affect gate to source bias leakage and time-dependent gate oxide breakdown (TDDB), which are important to the performance and the reliability of the wide bandgap semiconductor power device. Additionally, thermal annealing a device after formation of the gate dielectric can result in bulk trap sites in the gate dielectric, which can cause undesirable threshold voltage shifts during device operation.

BRIEF DESCRIPTION

In an embodiment, a wide bandgap semiconductor power device, includes a wide bandgap semiconductor substrate layer; an epitaxial semiconductor layer disposed above the wide bandgap semiconductor substrate layer; a gate dielectric layer disposed directly over a portion of the epitaxial semiconductor layer; and a gate electrode disposed directly over the gate dielectric layer. The gate electrode includes an in-situ doped semiconductor layer disposed directly over the gate dielectric layer and a metal-containing layer disposed directly over the in-situ doped semiconductor layer.

In another embodiment, a method of fabricating a gate electrode of a wide bandgap power device includes forming a semiconductor layer directly over a gate dielectric layer that is disposed at a surface of an epitaxial layer of the wide bandgap power device while using in-situ doping to dispose a plurality of dopant atoms in the semiconductor layer. The method includes forming a metal-containing layer directly over the semiconductor layer. The method also includes removing portions of both the semiconductor layer and the metal-containing layer to form the gate electrode from the remaining portions of the semiconductor layer and the metal-containing layer. The method further includes subsequently annealing the semiconductor layer of the gate electrode to activate the plurality of dopant atoms disposed in the semiconductor layer of the gate electrode.

In another embodiment, a method of fabricating a semiconductor gate electrode of a wide bandgap power device includes heating the wide bandgap power device to a predetermined temperature, wherein the wide bandgap power device includes a gate dielectric layer disposed at the surface of an epitaxial semiconductor layer. The method also includes activating a flow of a semiconductor feedstock gas and a flow of a dopant feedstock gas to form the semiconductor gate electrode directly over the dielectric layer. The method further includes annealing the semiconductor gate electrode to activate a plurality of dopant atoms previously deposited in the semiconductor gate electrode by the flow of the dopant feedstock gas.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
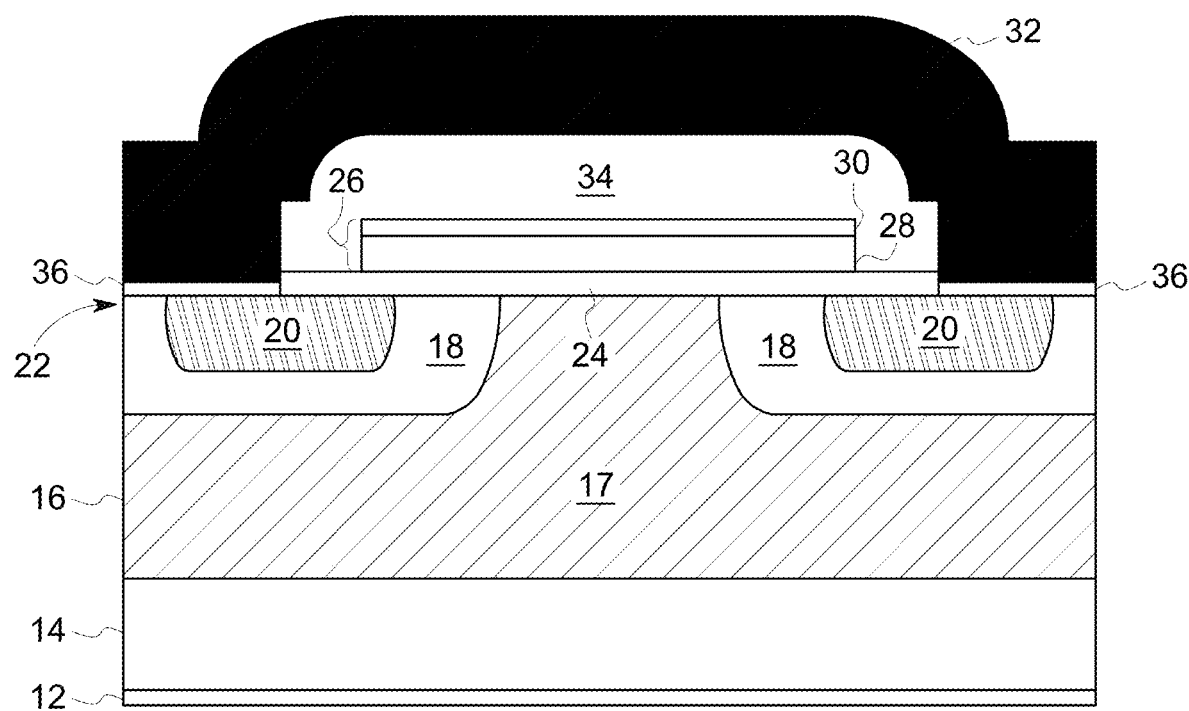
FIG. 1 is a cross-sectional schematic view of an active cell of a vertical re-channel field-effect transistor having a semiconductor gate electrode, in accordance with an embodiment of the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. As used herein, the terms "above" and "below," when used to describe the position of features of a device, are intended to describe two features that are above or below one another, in a particular orientation of the device, and may or may not include intervening features disposed therebetween. As used herein, the terms "directly over" or "directly under" are intended to describe two features that are in direct contact with one another in a particular orientation of the device.

As discussed above, wide bandgap semiconductor power devices may include semiconductor (e.g., polysilicon) gate electrodes. However, the typical doping treatments used to dope such semiconductor electrodes after formation may have detrimental effects to the performance and reliability of these wide bandgap semiconductor power devices. As such, present embodiments are directed toward wide bandgap semiconductor power devices, as well as methods of manufacturing the same, in which the semiconductor portion of the gate electrode is in-situ doped during formation, and then the dopant atoms of the semiconductor gate electrode are then subsequently activated during one or more later annealing steps. Further, the parameters of the in-situ doping and the conditions of the annealing step may be tuned to control the distribution of dopant atoms throughout the semiconductor gate electrode. As such, present embodiments enable the manufacture of wide bandgap semiconductor power devices having semiconductor gate electrodes having reduced (e.g., little or no) surface accumulation of dopant atoms, as well as having reduced (e.g., little or no) dopant atoms diffused into the underlying gate dielectric layer, which provide improved performance and reliability.

While the present approach may be discussed below specifically in the context of an example SiC MOSFET device, it should be appreciated the present approach may be applicable to other types of material systems (e.g., silicon (Si), germanium (Ge), aluminum nitride (AlN), gallium nitride (GaN), gallium arsenide (GaAs), diamond (C), or any other suitable wide bandgap semiconductor) as well as other types of device structures (e.g., UMOSFET, VMOSFETs, insulated gate bipolar transistors (IGBT), insulated base MOS-controlled thyristors (IBMCT), or any other suitable FET and/or MOS device) utilizing both n- and p-channel designs.

With the foregoing in mind, FIG. 1 illustrates an embodiment of an active cell of a vertical n-channel field-effect transistor, hereinafter MOSFET device 10. It may be appreciated that, in order to more clearly illustrate certain components of the MOSFET device 10, certain commonly understood design elements (e.g., top metallization, passivation, edge termination, and so forth) are omitted. The illustrated MOSFET device 10 of FIG. 1 includes a drain electrode 12 disposed on a side of a wide bandgap semiconductor substrate layer 14 that has a first conductivity type (e.g., n-type). An epitaxial semiconductor layer 16 (e.g., an n-type epitaxial SiC layer) having the first conductivity type is disposed directly over the substrate layer 14. For example, in certain embodiments, the epitaxial semiconductor layer 16 may be a SiC epitaxial layer having an n-type epitaxial doping concentration of approximately $6 \times 10^{15}$ cm$^{-3}$ disposed on top of an N+ 4H—SiC substrate layer 14.

The epitaxial semiconductor layer 16 includes a drift region 17 having the first conductivity type (e.g., an n-type drift region 17), as well as an implanted well region 18 having a second conductivity type (e.g., a p-well 18) disposed adjacent to the drift region 16 and proximal to a surface 22 of the epitaxial semiconductor layer 16. The epitaxial semiconductor layer 16 also includes an implanted source region 20 having the first conductivity type (e.g., n-type source region 20) adjacent to the well region 18 and proximal to the surface 22 of the epitaxial semiconductor layer 16.

For the embodiment of FIG. 1, a gate dielectric layer 24 (also referred to as a gate insulating layer 24) is disposed directly over a portion of the surface 22 of the epitaxial semiconductor layer 16, and a gate electrode 26 is disposed directly over the gate dielectric layer 24. The gate dielectric layer 24 may often include silicon dioxide (SiO$_2$), silicon nitride, or combinations thereof. Other suitable materials may include tantalum oxide (Ta$_2$O$_5$), alumina (Al$_2$O$_3$), zirconium oxide (ZrO$_2$), hafnium oxide (HfO$_2$) or other glass-forming materials. In some embodiments, the thickness of the gate dielectric layer may range between approximately 20 nanometers (nm) and approximately 200 nm. In certain instances, the thickness of the gate electrode 26 can be, for example, in a range of about 0.1 micrometer (μm) to about 1 μmm (e.g., approximately 0.5 μm).

Additionally, the illustrated gate electrode 26 includes a semiconductor layer 28 (e.g., a polysilicon layer 28) that is disposed directly over the gate dielectric layer 24. The gate electrode 26 also includes a metal-containing layer 30, also referred to as a strap layer 30, disposed directly over the semiconductor layer 28 of the gate electrode 26. As discussed in greater detail below, in certain embodiments, the metal-containing layer 30 may include or consist of a metal silicide (e.g., tantalum silicide). In certain embodiments, the semiconductor layer 28 may occupy more than half (e.g., 60%, between approximately 0.2 μm and approximately 0.6 μm, approximately 0.3 μm) of the thickness of the gate electrode 28. In other embodiments, the gate electrode 26 may not include the metal-containing layer 30, and the gate electrode 26 may be entirely comprised of the semiconductor layer 28, without negating the effect of the present approach.

As illustrated in FIG. 1, a metal (e.g., aluminum) source electrode 32 may be disposed over the surface of the wide bandgap semiconductor power device 10. The gate electrode 26 is isolated from this metal source electrode 32 by another dielectric layer 34, also referred to as the intermetal dielectric layer 34, which is disposed conformally over the top surface and sides of the gate electrode 26. Furthermore, as illustrated in FIG. 1, in certain embodiments, ohmic contact layers 36 may be disposed at the surface 22 of the epitaxial semiconductor layer 16, directly over a portion of the well region 18 and the source region 20 and directly under the source electrode 32. These ohmic contact layers 36 generally reduce the contact resistance between the source electrode 32 and the implanted regions of the epitaxial semiconductor layer 16. By specific example, in certain embodiments, the ohmic contact layers 36 may be metal silicide layers (e.g., nickel silicide layers).

Figure 2:
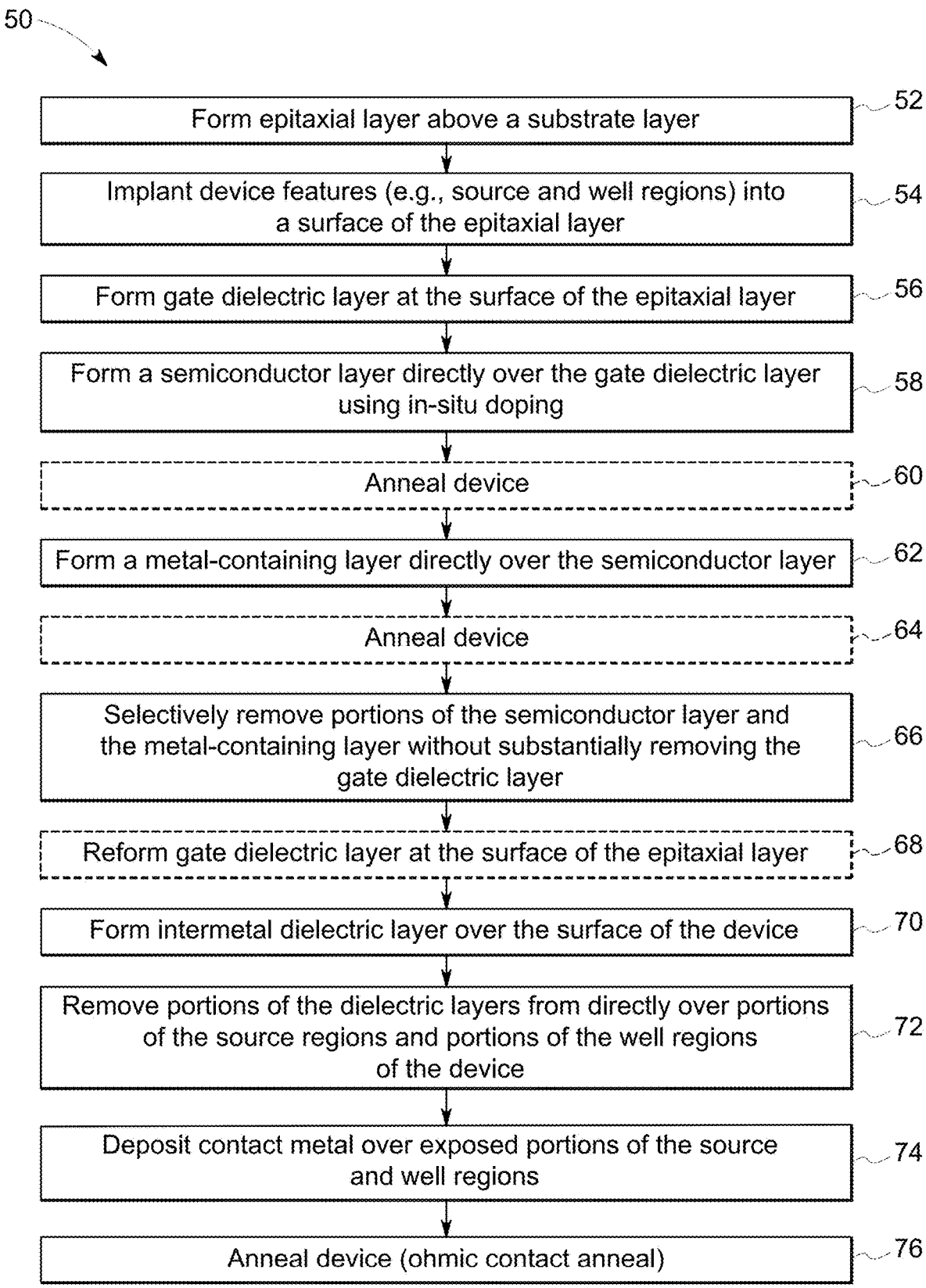
FIG. 2 is a flow diagram illustrating a process for fabricating a wide bandgap power device, in accordance with an embodiment of the present approach.

FIG. 2 illustrates an example of a process 50 for fabricating a wide bandgap power device in accordance with the present technique. It may be appreciated that, in other embodiments, the steps of the illustrated process 50 may be performed in other orders, additional steps may be performed, and illustrated steps may be skipped or otherwise eliminated. The illustrated process begins with forming (block 52) an epitaxial layer 16 above (e.g., directly over) a substrate layer 14 using, for example, chemical vapor deposition (CVD). After the epitaxial layer 16 is formed, a number of device features (e.g., well regions 18, source regions 20, etc.) are implanted (block 54) into the surface 22 of the epitaxial layer 16. Subsequently, a gate dielectric 24 may be formed (block 56) at the surface 22 of the epitaxial layer 16, typically by oxidizing a thin portion of the surface 22 of the entire epitaxial layer 16.

After the gate dielectric layer 24 is formed in block 56, the gate electrode 26 may then be fabricated. As illustrated in FIG. 2, this can be achieved by first forming (block 58) a semiconductor layer 28 directly over the gate dielectric layer 24 disposed at the surface 22 of the epitaxial layer 16. More specifically, the semiconductor layer 28 may be formed using CVD or low-pressure chemical vapor deposition (LP-CVD) and is doped in-situ during the deposition process, as discussed in greater detail below with respect to FIG. 3.

It may be appreciated that, at some point after forming the in-situ semiconductor layer 28, the semiconductor layer 28 should be annealed at least once to activate the dopant atoms present. As illustrated in block 60, in certain embodiments, the semiconductor layer 28 may optionally be annealed after deposition of the semiconductor layer 28 in block 58. In other embodiments, the semiconductor layer 28 may, additionally or alternatively, be annealed at a later time (e.g., after forming the metal silicide strap or during an ohmic contact annealing step), as discussed below. In certain embodiments, the annealing of block 60 may be an extended anneal (e.g., 850° C. for 30 minutes), a rapid thermal processing (RTP) anneal, or a pulse laser anneal. For example, a RTP anneal may include relatively higher temperatures (e.g., greater than 850° C., between approximately 900° C. and approximately 1200° C., at 950° C.) for shorter durations (e.g., between a few seconds and approximately 5 minutes, for approximately 3 min). A pulse laser anneal generally provides extremely rapid heating of the device over a shorter duration (e.g., less than 1 second). For example, a pulse laser system operating at, for example, a wavelength of approximately 308 nanometers (nm), can provide adequate thermal energy in a very short duration pulse (e.g., approximately 200 nanoseconds (ns)) to activate the dopant atoms without appreciably affecting the location of these dopant atoms due to diffusion.

The process 50 illustrated in FIG. 2 continues with forming (block 62) a metal-containing layer 30 directly over the semiconductor layer. For example, the metal-containing layer 30 may be formed by first depositing a metal (e.g., tantalum) onto the surface of a polysilicon semiconductor layer 28. The metal-containing layer 30, which may also be referred to herein as the strap 30, may include a metal selected from the group consisting of: tantalum, nickel, molybdenum, cobalt, titanium, tungsten, niobium, hafnium, zirconium, vanadium, aluminum, chromium, and platinum. In some embodiments, the metal-containing layer 30 includes a metal silicide, for example tantalum silicide. In general, the purpose of the metal-containing layer 30 is to allow increase in the speed of the operation of the device beyond a speed that the semiconductor layer 28 alone would provide. The metal-containing layer 30 reduces the composite gate resistance along its width, allowing the gate to charge and discharge its capacitance more quickly. As mentioned above, in other embodiments, a metal-containing layer 30 may not be used, and block 62 may be skipped altogether. Additionally, as mentioned above, in certain embodiments, the semiconductor layer 28 and the metal-containing layer 30 may, additionally or alternatively, receive an extended anneal (e.g., 850° C. for 30 minutes), a rapid thermal processing (RTP) anneal, or a pulse laser anneal, after formation of the metal-containing layer 30, as set forth in block 64.

Since the semiconductor layer 28 formed in block 58 and the metal-containing layer 30 formed in block 62 are typically formed over the entire surface of the partially formed wide bandgap semiconductor power device, portions of these layers are subsequently removed in order to form and shape the gate electrode 26 of the wide bandgap device 10. For example, the surface of the partially formed device, which is substantially covered with both the semiconductor layer 28 and the metal-containing layer 30, may be lithographically patterned and etched to define the dimensions of the gate electrode 26. In certain embodiments, as illustrated in block 66, the etching may be highly selective to the underlying gate dielectric layer 24 and, therefore, capable of removing both the metal-containing layer 30 and the semiconductor layer 28 without substantially removing the gate dielectric layer 24. Subsequently, depending on the extent that the gate dielectric layer 24 may have been compromised by the previous manufacturing steps, in certain embodiments, the partially formed device may optionally be reoxidized to reform the gate dielectric layer 24, as indicated in block 68. For example, in certain embodiments, surface may be heated to between approximately 700° C. and approximately 950° C. for between approximately 1 second and approximately 30 minutes under an atmosphere that includes oxygen (and possibly hydrogen). By specific example, in certain embodiments, the oxidation techniques may include one or more oxidation techniques described in co-pending U.S. patent application Ser. No. 14/182,765, entitled, "SILICON CARBIDE SEMICONDUCTOR DEVICES, AND METHODS FOR MANUFACTURING THEREOF," which is incorporated herein by reference in its entirety for all purposes.

As illustrated in FIG. 2, another dielectric layer 34, generally referred to as the intermetal dielectric layer 34, may then be formed (block 70) over the surface of the partially formed device 10. For example, the dielectric layer 34 may be deposited via CVD to a sufficient thickness to electrically isolate the gate electrode 26 from the source electrode 32 that is later deposited over the surface of the device 10, as illustrated in FIG. 1. As such, the dielectric layer 34 is deposited directly over (and generally conforms to) the gate electrode 26. Both the intermetal gate dielectric 34 and the gate dielectric layer 24 are then removed (e.g., lithographically patterned and etched away) (block 72) to expose portions of the source regions 20 and portions of the well regions 18 of the epitaxial layer 16.

Subsequently, in certain embodiments, a contact metal (e.g., nickel) may be deposited (block 74) over the exposed portions of the well regions 18 and the source regions 20 to reduce contact resistance at the interface between the source electrode 32 and the epitaxial semiconductor layer 16. After depositing this contact metal, the partially formed device 10 may be annealed (block 76) to yield an ohmic contact at these interfaces. For example, in certain embodiments, this ohmic contact anneal may cause at least a portion of the deposited contact metal to react with the surface 22 of the epitaxial semiconductor layer 16 to form the metal silicide layers 36 (e.g., a nickel silicide layers 36) directly over portions of the source regions 20 and portions of the well regions 18, as illustrated in FIG. 1. In particular, the annealing of block 76 may be a RTP anneal (e.g., 950° C. for 3 min) or a pulse laser anneal. As mentioned above, in certain embodiments, the annealing of block 76 may be the only anneal step that the device 10 receives that is capable of activating the dopant atoms in the semiconductor layer 28 of the gate electrode 26. It may be appreciated that other steps may be performed (e.g., deposition of the source electrode 32, deposition of the drain electrode 12, one or more packaging steps), as understood by those of skill in the art, to complete construction of the wide bandgap power device 10.

Figure 3:
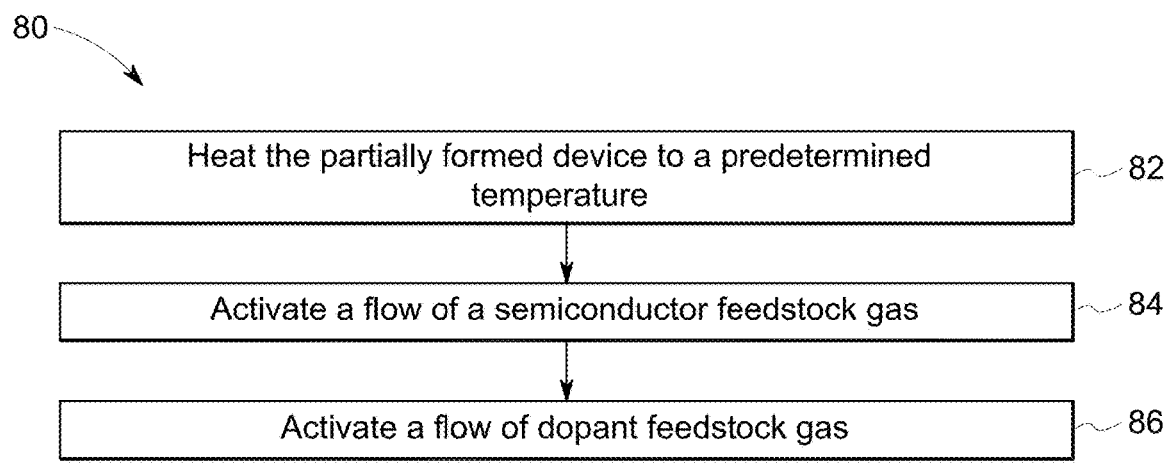
FIG. 3 is a flow diagram illustrating a process for fabricating a gate electrode of a wide bandgap power device, in accordance with an embodiment of the present approach.

FIG. 3 illustrates an embodiment of a process 80 for forming the semiconductor layer 28 of the gate electrode 26 directly over the gate dielectric layer 24 while using CVD or LPCVD and in-situ doping, as generally described in block 58 of FIG. 2. The process 80 begins with heating (block 82) the partially formed wide bandgap semiconductor power device 10 to a predetermined temperature. For example, the partially formed wide bandgap semiconductor power device 10 includes a gate dielectric layer 24 disposed across the surface 22 of the epitaxial semiconductor layer 16, as described in block 56 of FIG. 2. This partially formed device 10 may be heated to between approximately 500° C. and approximately 600° C. (e.g., 560° C.) in preparation of the deposition of the semiconductor layer 28 of the gate electrode 26.

Continuing through the process 80 illustrated in FIG. 3, next a flow of one or more semiconductor feedstock gases may be activated (block 84). For example, in certain embodiments, the semiconductor feedstock gas flow may include or consist essentially of silane ($SiH_4$). Additionally, at the same time or at a later time, a flow of dopant feedstock gas may be activated (block 86). For example, in certain embodiments, the dopant feedstock gas flow may include or consist essentially of phosphene ($PH_3$) (e.g., 1% $PH_3$ in argon). The amount of dopant feedstock gas added with the semiconductor feedstock gas can vary during the formation of the semiconductor layer 28 of the gate electrode 26. It may be appreciated that, based on the deposition conditions, the semiconductor layer 28 will form at a particular deposition rate (e.g., approximately 20 angstroms (Å) per minute), and therefore, the semiconductor feedstock gas flow and the dopant feedstock gas flow may be deactivated at an appropriate time to provide the semiconductor layer 28 of the desired thickness (e.g., 100-200 minutes).

Figure 4:
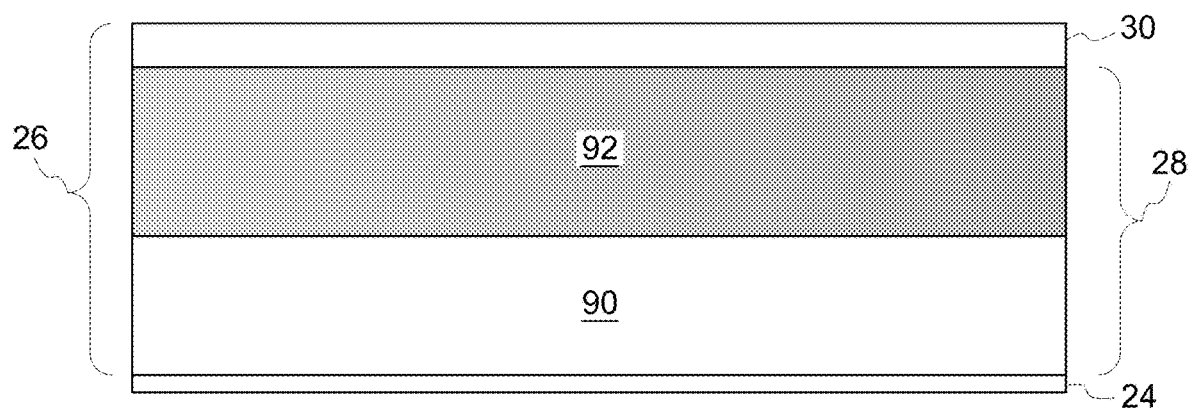
FIGS. 4-6 are partial cross-sectional schematic views of the gate electrodes for different embodiments of the present approach after formation of the semiconductor layers.

In certain embodiments, the semiconductor feedstock gas may be activated before the dopant feedstock gas such that the dopant concentration in the earlier formed portions of the semiconductor layer 28, nearest the gate dielectric layer 24, is lower than in the later formed portions of the semiconductor layer 28 of the gate electrode 26. For example, FIG. 4 illustrates an embodiment of a gate electrode 26 disposed directly over a gate dielectric layer 24 after deposition in accordance with this strategy. As illustrated in FIG. 4, the lower portion 90 of the semiconductor layer 28 was formed before the dopant feedstock gas flow was activated, and, therefore, this portion does not include a substantial amount of dopant atoms. The upper portion 92 of the semiconductor layer 28 was formed after the dopant feedstock gas flow was activated, and, therefore this portion includes a substantial amount of dopant atoms. As such, as illustrated in FIG. 4, the accumulation of dopant atoms in the lower portion 90 of the semiconductor layer 28 nearest the gate dielectric 24 is avoided.

Figure 5:
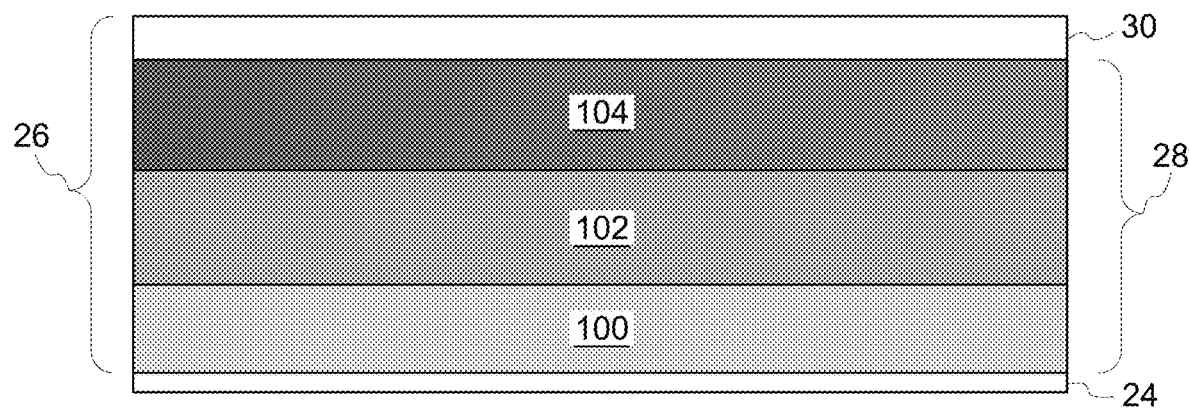

In certain embodiments, the dopant feedstock gas flow may be activated at the same time as the semiconductor feedstock gas flow, and the dopant feedstock gas flow may be relatively lower near the beginning of the deposition and relatively higher near the end of the deposition. For example, FIG. 5 illustrates an embodiment of a semiconductor layer 28 disposed directly over a gate dielectric layer 24 after deposition in accordance with this strategy. As illustrated in FIG. 5, the lower portion 100 of the semiconductor layer 28 was formed when the dopant feedstock gas flow was relatively low, and, therefore, includes a relatively low doping concentration. The middle portion 102 of the semiconductor layer 28 was formed after the dopant feedstock gas flow was increased, and, therefore this portion includes a relatively higher doping concentration. The upper portion 104 of the semiconductor layer 28 was formed after the dopant feedstock gas flow was again increased, and, therefore this portion includes the highest relative doping concentration of the semiconductor layer 28. As such, as illustrated in FIG. 5, this method also avoids the accumulation of dopant atoms in the lower portion 100 of the semiconductor layer 28 nearest the gate dielectric 24.

Figure 6:
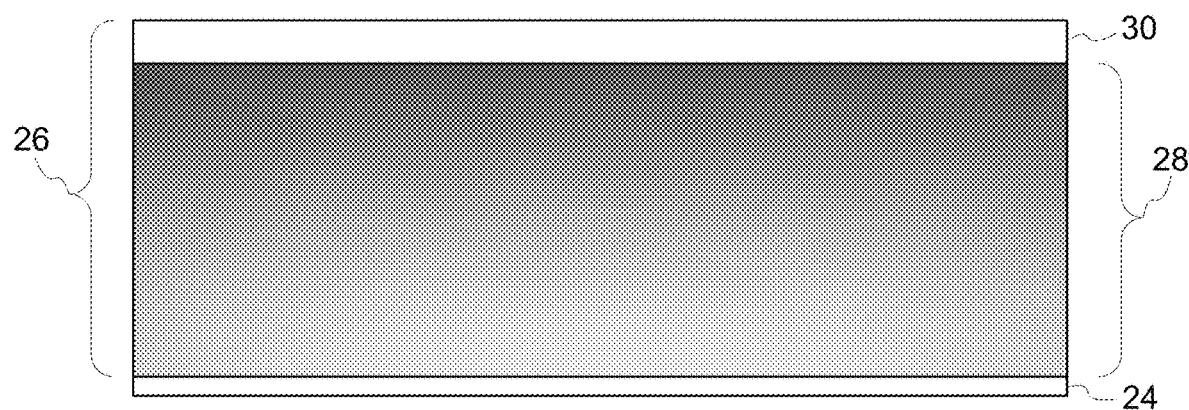

In certain embodiments, the dopant feedstock gas flow may be activated at the same time as the semiconductor feedstock gas flow, and the dopant feedstock gas flow may be gradually increased throughout the deposition. For example, FIG. 6 illustrates an embodiment of a semiconductor layer 28 disposed directly over a gate dielectric layer 24 after deposition in accordance with this strategy. As illustrated in FIG. 6, the semiconductor layer 28 was formed as the dopant feedstock gas flow was gradually varied from a relatively low flow to a relatively high flow over the course of the deposition. As such, as illustrated in FIG. 6, this method also avoids the accumulation of dopant atoms in the portion of the semiconductor layer 28 disposed nearest the gate dielectric 24.

Figure 7:
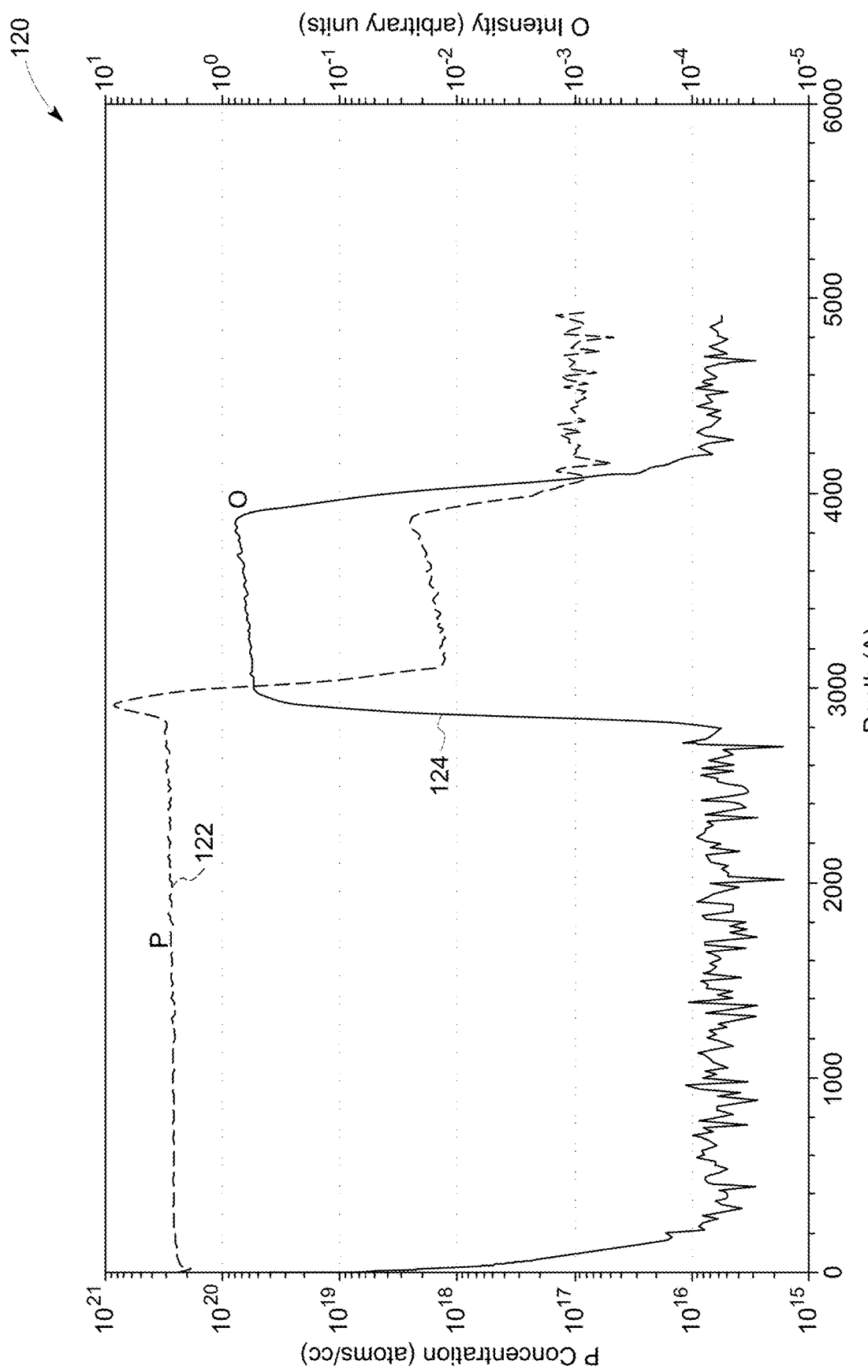
FIG. 7 is a plot illustrating secondary ion mass spectrometry (SIMS) data for a semiconductor layer doped using a traditional phosphoryl chloride doping treatment.

To better illustrate the improvement in dopant positioning within the gate electrode 26 provided by the present technique, FIG. 7 is a plot 120 illustrating secondary ion mass spectrometry (SIMS) data for an approximately 3000 Å polysilicon semiconductor layer 28 disposed directly over a gate dielectric layer 24 and that was doped using a traditional phosphoryl chloride doping treatment (e.g., 900° C. for 10 min in an atmosphere of phosphoryl chloride). In the plot 120 of FIG. 7, the x-axis represents depth into the polysilicon semiconductor layer 28 in angstroms, the left y-axis represents phosphorus concentration in number of atoms per cubic centimeter, and the right y-axis represents oxygen concentration in arbitrary units. As indicated by the curve 122 of the plot 120, the concentration of phosphorus abruptly increases at approximately 3000 Å, where the gate dielectric layer 24 begins, as indicated by the sudden increase in the oxygen signal represented by the curve 124. Accordingly, plot 120 demonstrates the accumulation of the dopant atoms at the bottom surface of the semiconductor layer 28, nearest the gate dielectric layer 24, for the gate electrode formed using the traditional phosphoryl chloride doping treatment.

Figure 8:
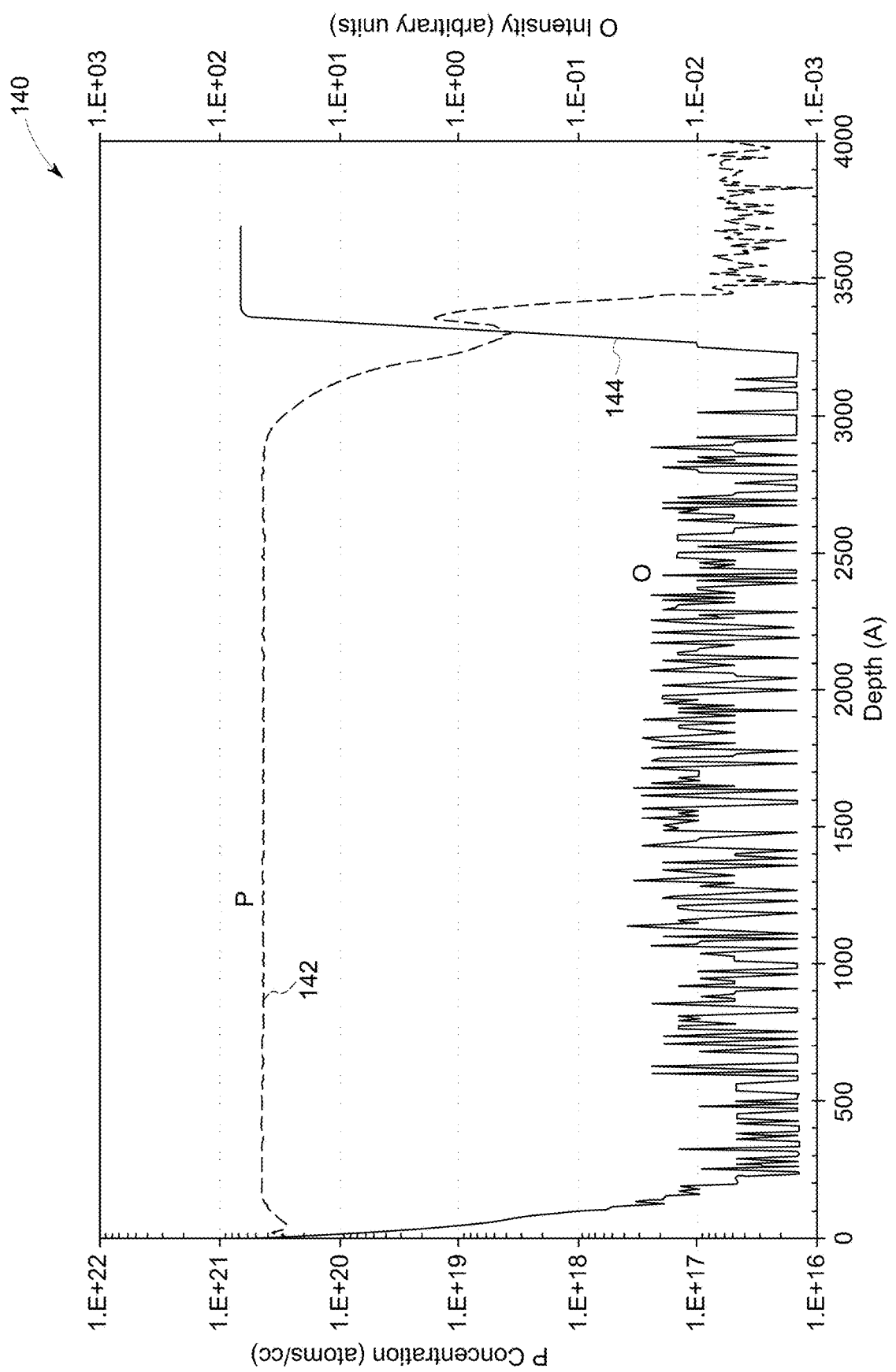
FIG. 8 is a plot illustrating SIMS data for an embodiment of a semiconductor layer after in-situ doping, in accordance with embodiments of the present technique.

In contrast, FIG. 8 is a plot 140 illustrating SIMS data for an embodiment of an approximately 3000 Å polysilicon semiconductor layer 28 disposed directly over a gate dielectric layer 24 after in-situ doping in accordance with the present technique. As illustrated by the curve 142 of the plot 140, the phosphorus concentration gradually decreases with increasing depth until the gate dielectric layer 24 is reached near approximately 3250 Å, as indicated by the sudden increase in the oxygen signal represented by the curve 144. Therefore, the plot 140 of FIG. 8 indicates a reduction in the concentration or accumulation of the dopant atoms at the bottom surface of the polysilicon semiconductor layer 28, nearest the gate dielectric layer 24. It may be appreciated that annealing (e.g., as described in blocks 60, 64, and/or 76 of FIG. 2) can also encourage the accumulation of the dopant atoms at the bottom surface of the semiconductor layer 28, nearest the gate dielectric layer 24. However, it is presently believed that the conditions of the one or more annealing steps can be adjusted and controlled to preserve at least a portion of the reduction in the concentration or accumulation of the dopant atoms at the bottom surface of the semiconductor layer 28, nearest the gate dielectric layer 24, as illustrated by the plot 140 of FIG. 8.

Additionally, the in-situ doping of the semiconductor layer 28 of the gate electrode 26 provides other advantages. For example, as illustrated in Table 1, the device D1, which received the traditional phosphoryl chloride treatment, demonstrated a sheet resistance of between approximately 30 ohms per square centimeter (ohms/cm$^2$) and approximately 50 ohms/cm$^2$. By comparison, as illustrated by the device D2, the sheet resistance of an in-situ doped semiconductor layer is generally less than 30 ohms/cm$^2$. It may be appreciated that this reduced sheet resistance may provide performance improvements to embodiments of the wide bandgap power devices of the present approach compared to other devices.

device D4 of the present approach, which received only a RTP anneal after forming a TaSi$_2$ metal-containing layer 30 of the gate electrode 26, demonstrates a substantially (e.g., between approximately 15% and approximately 30%) lower sheet resistance than the traditionally doped device D1. For example, in certain embodiments, the present approach may enable the manufacture of wide bandgap semiconductor power devices having gate electrodes (with or without the metal-containing layer 30) having a sheet resistance less than approximately 4.2 ohms/cm$^2$ (e.g., less than 4.2 ohms/cm$^2$, between approximately 3.6 ohms/cm$^2$ and approximately 3.8 ohms/cm$^2$). It may be appreciated that this reduced sheet resistance may provide performance improvements to embodiments of the wide bandgap power devices of the present approach compared to other devices.

Figure 9:
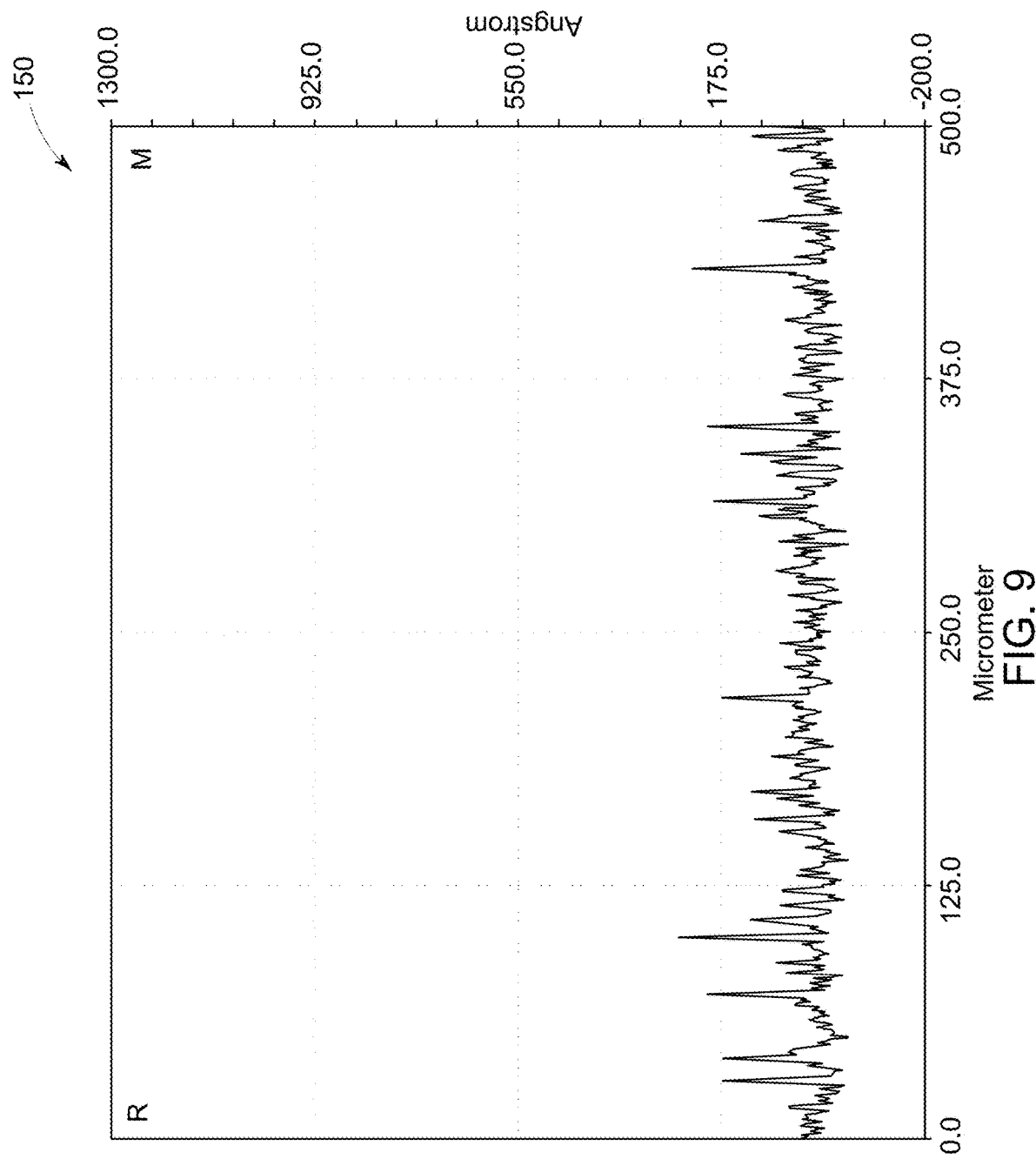
FIG. 9 is a surface profile of partially fabricated wide bandgap devices after formation of a traditionally doped semiconductor layer and metal silicide layer.
Figure 10:
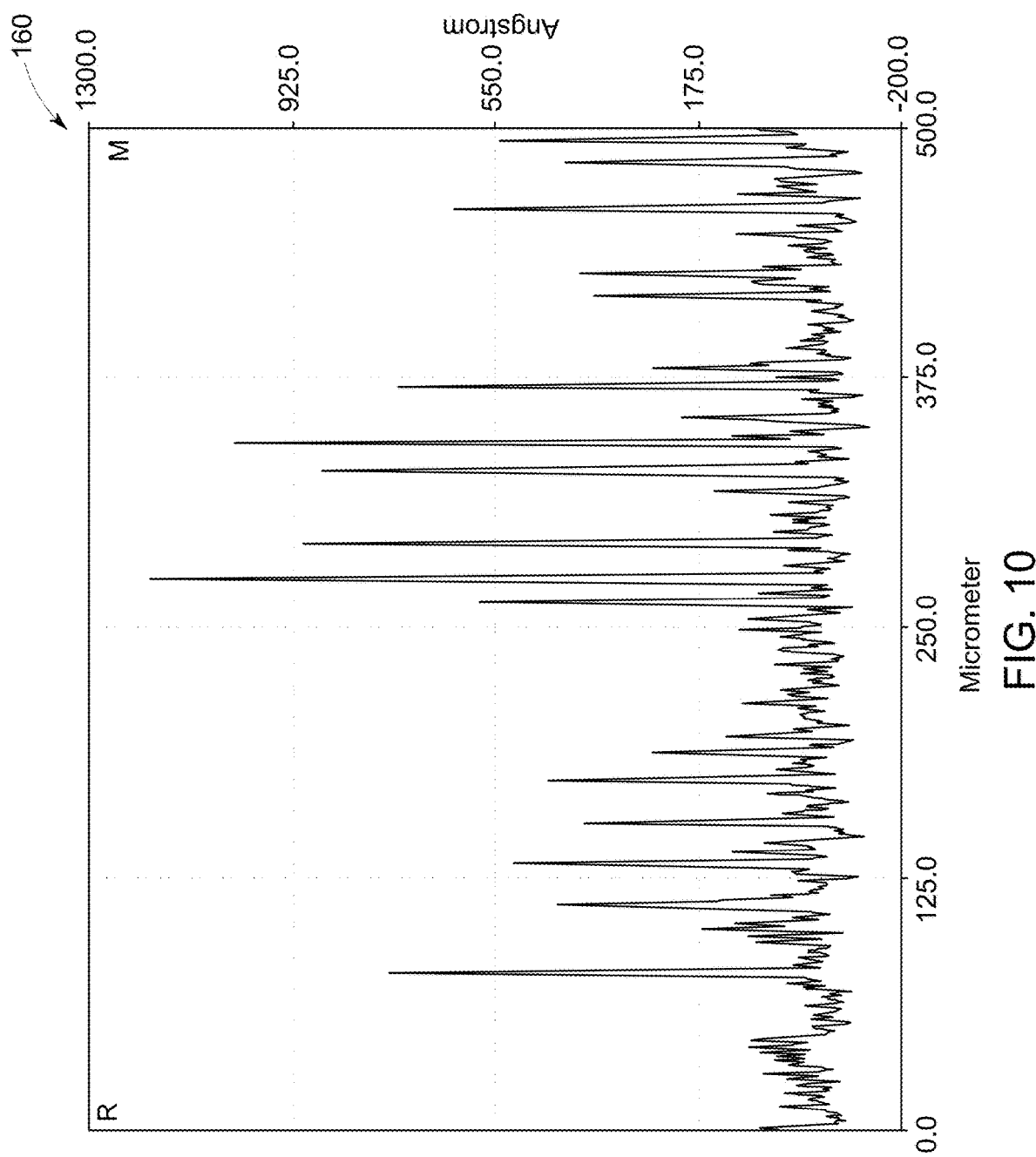
FIGS. 10-12 are surface profiles of partially fabricated wide bandgap devices after formation of the in-situ doped semiconductor layer and metal silicide layer while utilizing different annealing procedures, in accordance with embodiments of the present approach.
Figure 11:
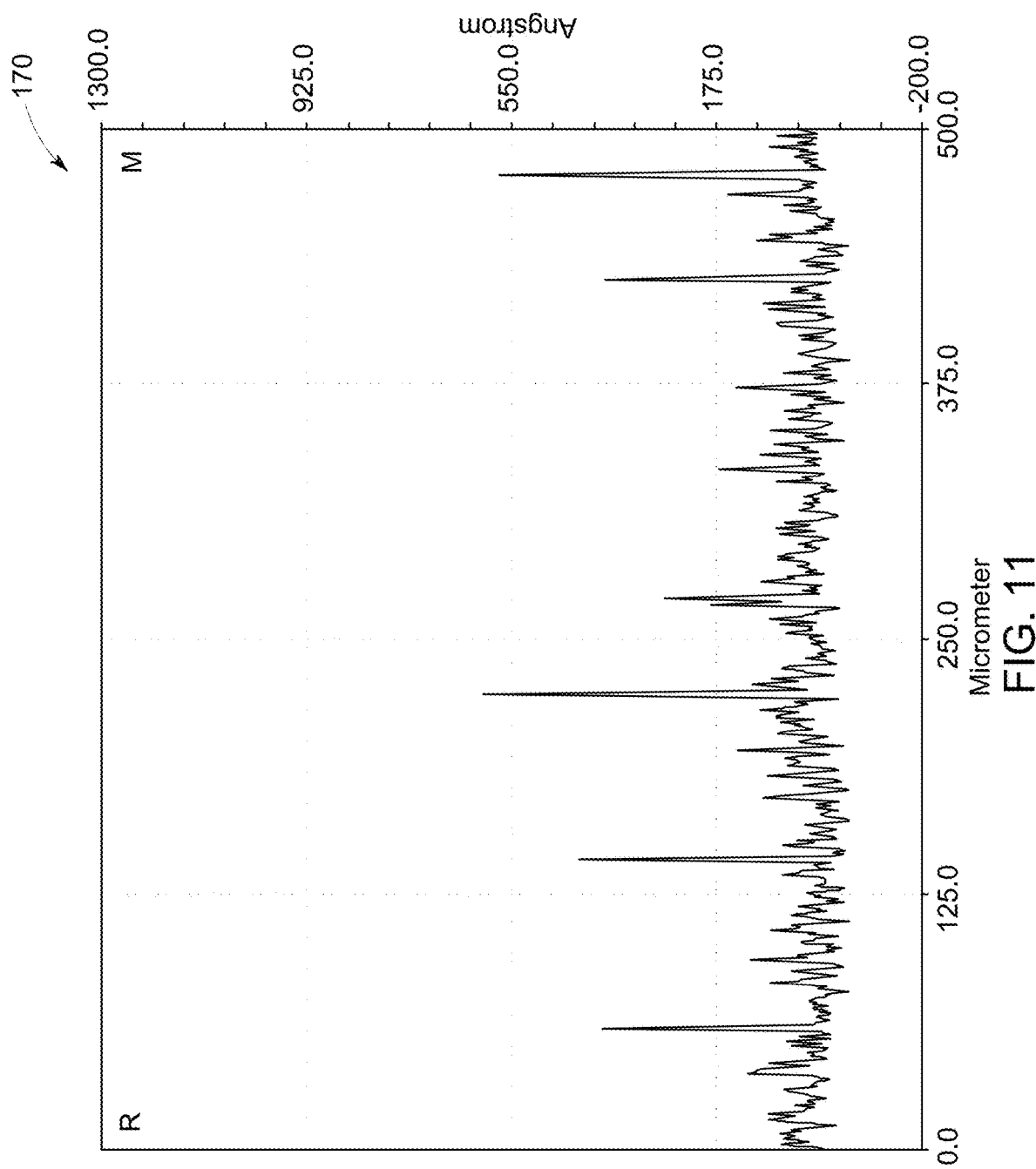
Figure 12:
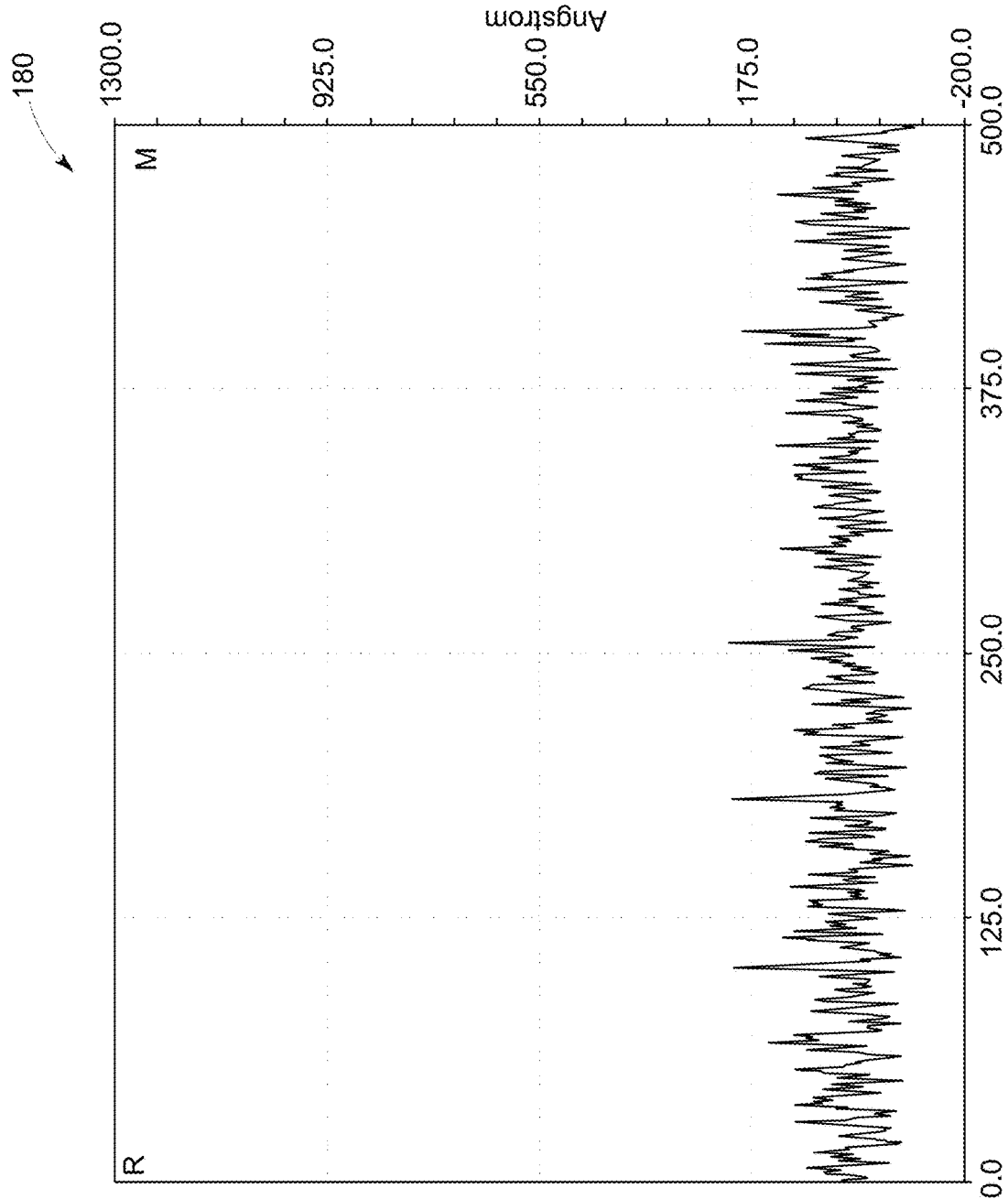

Table 1 also indicates that the annealing steps (e.g., as discussed in blocks 60, 64, and 76 of FIG. 2) may also play an unexpected role in the roughness of the surface after deposition of the TaSi$_2$ metal-containing layer 30. For example, FIG. 9 is a plot 150 illustrating the low surface roughness along the relatively smooth surface of the device D1 after treatment with POCl$_3$ and metal silicide deposition. For embodiments of the present approach, the in-situ doping and/or annealing can introduce additional surface roughness. For example, embodiments D2 and D3 of the present approach, which received extended annealing treatments, both presented additional surface roughness, as illustrated in the plots 160 and 170 of FIGS. 10 and 11, respectively. However, surprisingly, embodiment D4 of the present approach, which received only the RTP anneal, provided an exceedingly low surface roughness, as illustrated by the plot 180 of FIG. 12. It is believed that this low surface roughness further improves the performance and reliability of the wide bandgap semiconductor power devices of the present approach. For example, dielectric passivation integrity might be compromised when disposed over a rough conductive surface due to thinning in certain areas, thereby forming potential leakage paths between conductive layers 26 and 32. Additionally, it is probable the roughness seen in FIGS. 10 and 11 occurs at both the top and base interfaces of gate electrode 26, which would also compromise the integrity of underlying gate dielectric layer 24. Finally, it is difficult to selectively etch a rough gate electrode 26 without removing excessive portions of the underlying gate dielectric layer 24, thereby thinning and compromising the electrical reliability of this gate dielectric layer 24. It is, therefore, advantageous that present embodiments enable the

TABLE 1

Comparison of a wide bandgap semiconductor device receiving a traditional phosphoryl chloride treatment (i.e., 900° C. for 10 min in an atmosphere of phosphoryl chloride) (D1) versus embodiments of the wide bandgap semiconductor devices having a gate electrode that is in-situ doped (D2, D3, D4), in accordance with the present approach.

| Device | Doping | Anneal After Forming polySi | Sheet Resistance polySi | Anneal After Forming Strap | Sheet Resistance polySi/Strap | Surface |
|---|---|---|---|---|---|---|
| D1 | POCl$_3$ | — | 29-47 ohms/cm$^2$ | 30 min at 850° C. | 4.2-4.7 ohms/cm$^2$ | smooth |
| D2 | In-situ | 30 min at 850° C. | 27-29 ohms/cm$^2$ | 30 min at 850° C. | 4.1-4.3 ohms/cm$^2$ | rougher |
| D3 | In-situ | — | — | 30 min at 850° C. | 4.2-4.5 ohms/cm$^2$ | rough |
| D4 | In-situ | — | — | 3 min at 950° C. | 3.6-3.8 ohms/cm$^2$ | smooth |

Table 1 also indicates that the annealing steps (e.g., as discussed in blocks 60, 64, and 76 of FIG. 2) may further enable particular unexpected performance advantages relative to the traditionally doped device D1. For example, fabrication of an exceedingly smooth gate electrode 26, as demonstrated by the plot 180 of FIG. 12.

The technical effects of the present technique include systems and methods for fabricating wide bandgap semiconductor power devices having in-situ doped gate electrodes. During the disclosed formation of the semiconductor layer of a gate electrode, the flow of a dopant feedstock gas can be controlled to strategically position the dopant atoms in the semiconductor layer. By reducing or eliminating the accumulation of dopant at or near the gate dielectric layer, wide bandgap semiconductor power devices having improved performance and reliability of can be fabricated, in accordance with present techniques.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of fabricating a gate electrode of a power device, comprising:
    forming a semiconductor layer directly over a gate dielectric layer that is disposed at a surface of an epitaxial layer of the power device while using in-situ doping to dispose a plurality of dopant atoms in the semiconductor layer;
    forming a metal-containing layer directly over the semiconductor layer;
    removing portions of both the semiconductor layer and the metal-containing layer to form the gate electrode from the remaining portions of the semiconductor layer and the metal-containing layer; and
    annealing the semiconductor layer of the gate electrode to activate the plurality of dopant atoms disposed in the semiconductor layer of the gate electrode, wherein annealing the semiconductor layer comprises activating the plurality of dopant atoms of the semiconductor layer while forming an ohmic contact directly over a portion of a source region and a portion of a well region disposed in the surface of the epitaxial layer of the power device.

2. The method of claim 1, wherein annealing the semiconductor layer of the gate electrode to activate the plurality of dopant atoms disposed in the semiconductor layer of the gate electrode is done after forming the metal-containing layer.

3. The method of claim 1, wherein the power device is a silicon carbide (SiC) power device, wherein the semiconductor layer is a polycrystalline silicon semiconductor layer, and wherein the metal-containing layer is a tantalum silicide ($TaSi_2$) layer.

4. The method of claim 1, wherein removing the portions of the semiconductor layer and the metal-containing layer comprises selectively etching portions of the semiconductor layer and the metal-containing layer without removing a portion of the gate dielectric layer.

5. The method of claim 1, comprising reforming at least a portion of the gate dielectric layer after removing the portions of the semiconductor layer and the metal-containing layer of the gate electrode.

6. The method of claim 1, wherein annealing the semiconductor layer comprises heating the power device to at least 850° C. for at least one minute.

7. The method of claim 1, wherein annealing the semiconductor layer comprises heating the power device to at least 850° C. for less than 5 minutes.

8. The method of claim 1, wherein annealing the semiconductor layer comprises heating the power device to at least 950° C. for 3 minutes.

9. The method of claim 1, wherein annealing the semiconductor layer comprises heating the power device to at least 950° C. using a pulse laser anneal for a time of less than 1 second.

* * * * *